United States Patent [19]

Davenport et al.

[11] Patent Number: 5,507,499
[45] Date of Patent: Apr. 16, 1996

[54] METHOD OF SEALING USEFUL IN SEMICONDUCTOR PROCESSING APPARATUS FOR BRIDGING MATERIALS HAVING A THERMAL EXPANSION DIFFERENTIAL

[75] Inventors: Robert E. Davenport, San Jose; Avi Tepman, Cupertino, both of Calif.

[73] Assignee: Applied Materials, Inc., Santa Clara, Calif.

[21] Appl. No.: 436,057

[22] Filed: May 5, 1995

Related U.S. Application Data

[62] Division of Ser. No. 73,029, Jun. 7, 1993.

[51] Int. Cl.[6] ............................................ F16J 15/08
[52] U.S. Cl. .......................... 277/1; 277/236; 228/124.6; 228/189; 403/270; 403/272
[58] Field of Search .................. 277/1, 26, 236; 118/500; 204/298.15; 403/220, 270, 272, 273; 228/56.3, 124.6, 189

[56] References Cited

U.S. PATENT DOCUMENTS

| | | | |
|---|---|---|---|
| 1,716,157 | 6/1929 | Ulrey et al. | 403/270 |
| 2,858,126 | 10/1958 | Gomez | 277/236 |
| 2,972,808 | 2/1961 | Litton | 228/124.6 |
| 3,124,714 | 3/1964 | Bendorf | 228/124.6 |
| 4,073,427 | 2/1978 | Keifert et al. | 403/272 |
| 4,771,730 | 9/1988 | Tezuka . | |
| 4,897,171 | 1/1990 | Ohmi . | |
| 4,991,991 | 2/1991 | Ito et al. | 403/272 |
| 5,073,716 | 12/1991 | Clemens et al. . | |
| 5,104,834 | 4/1992 | Watanabe et al. . | |
| 5,134,436 | 7/1992 | Fujioka . | |
| 5,155,652 | 10/1992 | Logan et al. . | |
| 5,179,498 | 1/1993 | Hongoh et al. . | |
| 5,191,506 | 3/1993 | Logan et al. . | |
| 5,265,790 | 11/1993 | Mumford, III et al. | 228/189 |

OTHER PUBLICATIONS

A. Roth: "Vacuum Selaing Techniques"; Jan. 1, 1970; pp. 95–97.

*Primary Examiner*—Scott W. Cummings
*Attorney, Agent, or Firm*—Shirley L. Church; Donald J. Verplancken

[57] ABSTRACT

The present invention pertains to an apparatus and method useful in semiconductor processing. The apparatus and method can be used to provide a seal which enables a first portion of a semiconductor processing chamber to be operated at a first pressure while a second portion of the semiconductor processing chamber is operated at a second, different pressure.

The sealing apparatus and method enable processing of a semiconductor substrate under a partial vacuum which renders conductive/convective heat transfer impractical, while at least a portion of the substrate support platform is under a pressure adequate to permit heat transfer using a conductive/convective heat transfer means. The sealing apparatus comprises a thin, metal-comprising layer, typically in the form of a strip or band, brazed to at least two different surfaces within said processing chamber, whereby the first and second portions of the semiconductor processing chamber are pressure isolated from each other. Preferably, the metal-comprising layer exhibits a cross-sectional thickness of less than about 0.039 in. (1 mm).

The invention is particularly useful when there is a differential in linear expansion coefficient of at least $3\times10^{-3}$ in./in./°C., measured at 600° C., between the surfaces to be bridged by the thin, metal-comprising layer.

3 Claims, 2 Drawing Sheets

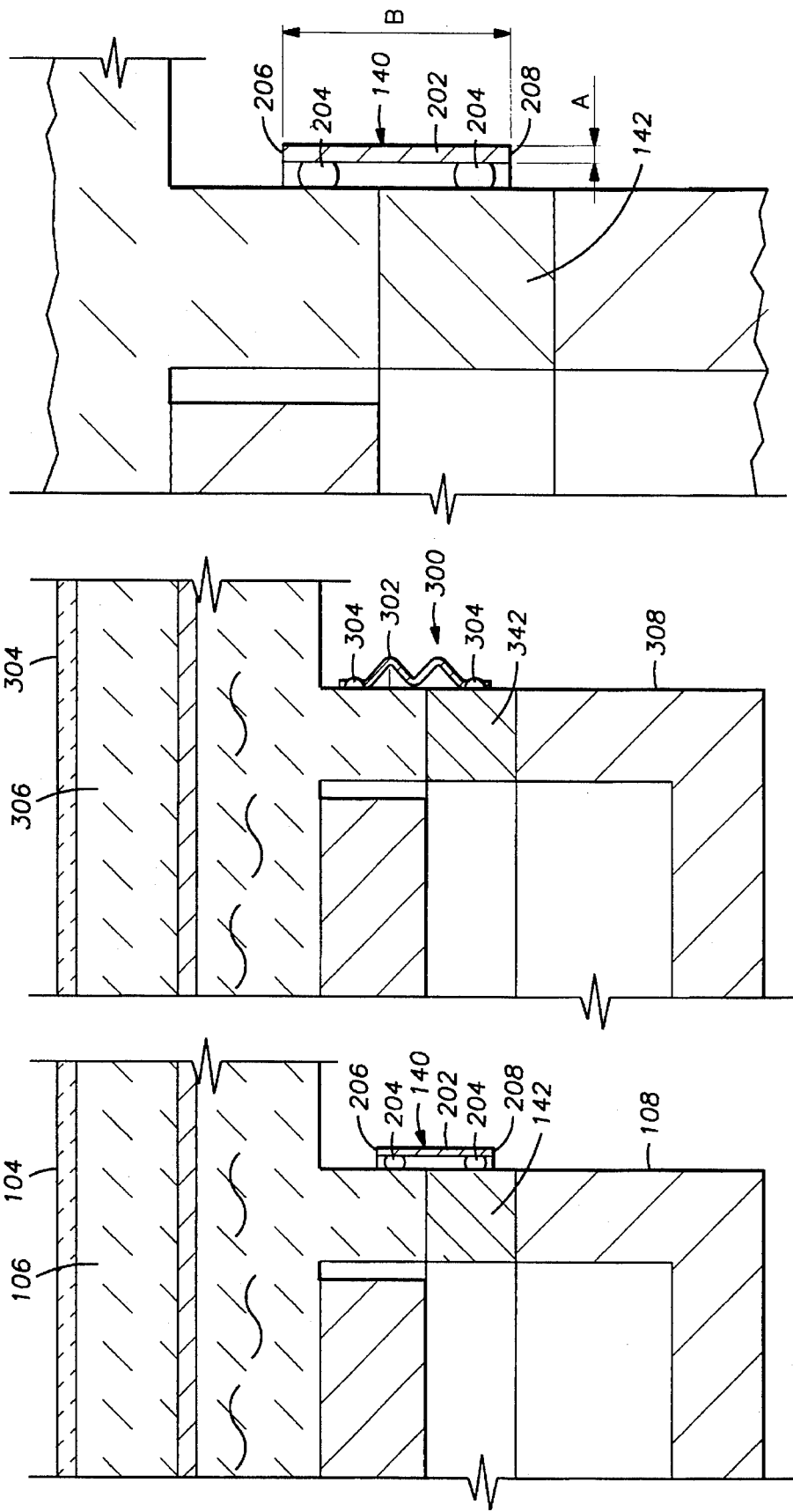

METHOD OF SEALING USEFUL IN SEMICONDUCTOR PROCESSING APPARATUS FOR BRIDGING MATERIALS HAVING A THERMAL EXPANSION DIFFERENTIAL

This application is a Divisional Application of prior U.S. application Ser. No. 08/073,029, filed Jun. 7, 1993.

BACKGROUND OF THE INVENTION

1. Field of the Invention

The present invention relates to an apparatus and method which can be used to provide a seal between two portions of a semiconductor processing reactor which are operated at different pressures. The apparatus and method are particularly useful when the processing reactor operates over a broad temperature range (about 600° C.) and the seal must bridge two materials having a substantially different coefficient of expansion. 2. Description of the Background Art In the fabrication of electronic components such as semiconductor devices, the manufacturing process frequently requires that a substrate be cooled while that substrate is exposed to a partial pressure of about $10^{-3}$ Torr or lower. Processes which require substrate cooling under such partial vacuum conditions include, for example, physical vapor deposition (PVD), ion injection and particular forms of plasma etching.

PVD is used to deposit a thin film on a substrate. Films of materials such as, for example, aluminum, titanium, tungsten, tantalum, tantalum nitride, cobalt, and silica may be deposited on ceramic, glass or silicon-derived substrates using PVD processes such as a sputtering process. In a typical sputtering process, a low pressure atmosphere of an ionizable gas such as argon or helium is produced in a vacuum chamber. The pressure in the vacuum chamber is reduced to about $10^{-6}$ to $10^{-10}$ Torr, after which argon, for example, is introduced to produce an argon partial pressure ranging between about 0.0001 Torr (0.1 mTorr) and about 0.020 Torr (20 mTorr). Two electrodes, a cathode and an anode, are generally disposed in the vacuum chamber. The cathode is typically made of the material to be deposited or sputtered, and the anode is generally formed by the enclosure (particular walls of the vacuum chamber, or the platform upon which the substrate sits, for example). At times, an auxiliary anode may be used or the article to be coated may serve as the anode. A high voltage is applied between these two electrodes, and the substrate to be coated is disposed upon a platform positioned opposite the cathode. The platform upon which the substrate sets is often heated and/or cooled, and heat is transferred between the platform and the substrate, to assist in obtaining a smooth, even thin film coating upon the substrate. To obtain a smooth, even film coating, it is desirable to maintain the substrate at a uniform temperature within a few °C.; preferably, the temperature is near but below the melting point of the material from which the film is being formed. It is very important that the substrate temperature be repeatable each time a given process is carried out. Thus, the heat transfer between the platform and the substrate must be uniform and repeatable.

When the pressure in the process (vacuum) chamber is about 1 Torr or less, convective/conductive heat transfer becomes impractical. This low pressure environment affects heat transfer between the substrate and the support platform; it also affects heat transfer between the support platform and heat transfer means such as a heating or cooling coil used adjacent to the platform to heat or cool the platform.

Since the substrate and the platform typically do not have the perfectly level surfaces which would enable sufficiently even heat transfer by direct conduction, it is helpful to provide a heat transfer fluid between the platform and the substrate, to assist in providing even heat transfer between the support platform and the substrate. It is known in the art to use one of the gases present in a PVD sputtering process as a heat transfer fluid between the support platform and the substrate. The fluid is typically a gas such as helium, argon, hydrogen, carbon tetrafluoride, or hexafluoroethane, for example, or other suitable gas that is a good heat conductor at low pressure. The fluid is generally applied through multiple openings or into exposed channels in the substrate-facing surface of the support platform. Presence of the heat transfer fluid between the substrate and support platform surface establishes a nearly static gas pressure which commonly ranges from about 1 Torr to about 100 Torr, depending on the particular film deposition process.

The positive pressure created by the heat transtar fluid used between the back (non-processed) side of the substrate and its support platform, as described above, tends to bow a thin substrate which is mechanically clamped at its edge. Bowing of the substrate in excess, for example 10 micrometers at the center of a typical silicon wafer substrate, was observed when the periphery of the substrate was held by mechanical clamps. This substrate bowing reduces the amount of heat transfer near the center of the substrate and results in uneven heating of the substrate in general. Further, the gas used to provide a heat transfer fluid between the substrate and the support platform leaks from the edges of the substrate so that a constant net flow of fluid occurs from beneath the substrate into the process vacuum chamber. The amount of gas leakage commonly ranges from about 10% to about 30% of the gas used during processing of the substrate.

One means of avoiding bowing of the substrate and of reducing heat transfer fluid leakage at the substrate edge is the use of an electrostatic chuck as the support platform. An electrostatic chuck secures the entire lower surface of a substrate by Coulombic force and provides an alternative to mechanical clamping of the substrate to the support platform. When a substrate is secured to the platform using an electrostatic chuck, the flatness of the substrate during processing is improved. In a typical electrostatic chuck, the substrate (comprised of a semiconductor material or a non-magnetic, electrically conductive material) effectively forms a first plate of a parallel-plate capacitor. The remainder of the capacitor is generally formed by the substrate support platform which typically comprises a dielectric layer positioned on the upper surface of a second conductive plate.

The support platform upon which the substrate sets can be heated or cooled in a variety of manners, depending on the kind of process to be carried out in the process chamber. For example, radiant, inductive, or resistance heating can be used to heat a support platform; the platform can be heated or cooled using a heat transfer fluid which is circulated through internal passageways within the support platform; in the alternative, heating or cooling can be achieved using a heat transfer surface such as a heating or cooling coil which is located adjacent to, frequently in contact with, the support platform. The means of heating or cooling the support platform often depends on the materials of construction of the platform itself. When the partial pressure in the process chamber is less than about 1 Torr, the support platform cannot be heated or cooled using a heat transfer surface adjacent the support platform, since convection/conduction of heat cannot occur at a practical rate.

There are numerous materials of construction and structural possibilities described in the art which can be used to form an electrostatic chuck. The means for heating and cooling the electrostatic chuck (from which the substrate can be heated or cooled) depends on the materials of construction used and the overall structure of the electrostatic chuck.

U.S. Pat. No. 4,771,730 to Masashi Tezuka, issued Sep. 20, 1988 describes an electrostatic chuck comprised of a conductive specimen table (probably constructed from a metallic material such as aluminum) having hollow conduits therein for the circulation of water. Mounted to the upper surface of the specimen table is an electrode comprising an electrode plate constructed of a metal such as aluminum, surrounded by a dielectric film of a material such as $Al_2O_3$ (alumina). The substrate to be processed sets upon the upper surface of the dielectric film material. It is readily apparent that the sandwiched materials of construction which make up the electrostatic chuck have vastly different coefficients of expansion. Upon exposure of the sandwiched materials to operational temperature ranges of several hundred degrees Centigrade, stress is created between the sandwiched layers which can lead to deformation or fracture of the more fragile layers and to poor performance and eventual failure of the electrostatic chuck in general.

U.S. Pat. No. 5,155,652 to Logan et al., issued Oct. 13, 1992, discloses an electrostatic chuck assembly including, from top to bottom: a top isolation layer; an electrostatic pattern layer comprised of an electrically conductive electrostatic pattern disposed on a substrate; a heating layer comprised of an electrically conductive heating pattern disposed on a substrate; a support layer; and a heat sink base having backside cooling and insulating channels provided therein. The preferred material for the isolation layer is Boralloy 11®, a pyrolytic boron nitride available from Union Carbide. The electrostatic pattern layer is not particularly defined. The heating layer is comprised of a substrate, preferably pyrolytic boron nitride having a conductive heating pattern disposed thereon. The conductive heating pattern is preferably comprised of a pyrolyric graphite. The support layer is preferably comprised of a boron nitride having metal vias disposed therethrough for conducting electrical energy to metal vias within the hearing layer. The heat sink base is comprised of a thermally conductive block of material having clearance holes extending therethrough for facilitating electrical contact with the metal vias of the support layer. The heat sink base also has channels therein for the circulation of a cooling fluid. The material of selection for heat sink base is said to be critical because it must match the thermal expansion rate of all the other layers in the structure. It is recommended that KOVAR®, an iron/nickel/cobalt alloy available from Westinghouse Electric Co. be used to form the heat sink base.

The heat ink base is said to be bonded to the bottom of the support layer using one of several techniques. The techniques include brazing, whereby gold contact pads are deposited on the respective bonding surfaces, the pieces are fitted together, and the assembly is heated in a brazing furnace. A second method of bonding the heat sink base to the bottom of the support layer is to apply a thermally conductive ceramic cement. A third method is to mechanically clamp the two pieces together by fabricating a flange on the bottom of the support layer and a clamp ring on the top of the heat sink base.

The kind of structure described in the Logan et al. is very expensive to construct, both in terms of materials of construction and fabrication of the structure itself.

U.S. Pat. No. 5,191,506 to Logan et al., issued Mar. 2, 1993 describes an electrostatic chuck assembly including, from top to bottom: a top multilayer ceramic insulating layer; an electrostatic pattern layer having a conductive electrostatic pattern disposed upon a multilayer ceramic substrate; a multilayer ceramic support layer; and a heat sink base having backside cooling channels machined therein. The multilayer ceramic structures are bonded together using known techniques applicable to multilayer ceramics, and the heatsink base is brazed to the bottom of the multilayer ceramic support layer. The materials of construction are essentially equivalent to the materials of construction described in U.S. Pat. No. 5,155,652. The heat sink base is said to be brazed to the electrostatic pattern layer by depositing gold contact pads on the respective bonding surfaces, fitting the pieces together, and heating the assembly in a brazing furnace.

In the above-referenced U.S. patents, when cooling is involved, the cooling is accomplished by using a fluid flowing: a) in direct contact with either a specialized metal alloy having a coefficient of expansion matched to that of a dielectric material with which it was in contact, or b) in direct contact with the dielectric material itself. This is necessary since the entire vacuum chamber in which substrate processing is carried out is operated at a partial vacuum which renders conductive/convective heat transfer impractical. The use a specialized metal alloy heatsink base of the kind described in the above-referenced patents is very expensive. Further, direct contact of the cooling fluid with the kinds of dielectric materials generally described may not provide effective heat transfer and may result in fracture of the dielectric material itself. The ceramic materials typically used as dielectrics are commonly sensitive to temperature differential, and the temperature differential between a heating element and a nearby cooling element can cause the ceramic to fracture.

It would be very advantageous to have a means for cooling an electrostatic chuck (or any other substrate support platform used in low pressure semiconductor processing) which did not require the use of such expensive materials of construction and which provided an efficient means of heat transfer.

SUMMARY OF THE INVENTION

In accordance with the present invention, an apparatus and method are disclosed which can be used to provide a seal between two portions of a semiconductor processing reactor which are operated at different pressures. The seal enables processing of the substrate under a partial vacuum which renders conductive/convective heat transfer impractical, while at least a portion of the substrate support platform, removed from the substrate contacting portion, is under a pressure adequate to permit heat transfer using a conductive/convective heat transfer means.

The apparatus of the present invention comprises a sealing apparatus capable of withstanding a pressure differential, typically about 15 psi ($15.15 \times 10^6$ dynes/cm$^2$) or less, over a temperature range of at least 300° C., while bridging at least two materials having a substantial difference in linear expansion coefficient. The difference in linear expansion coefficient depends upon the composition of the materials being bridged, but is typically at least about $3 \times 10^{-3}$ in./in./°C. (m/m/°C.), measured at about 600° C. Preferably, the sealing means can withstand a pressure differential of at least about 15 psi during operational temperatures ranging from about 0° C. to about 600° C. while bridging two materials having a difference in linear expansion coefficient ranging from about $3\times10^{-3}$ °C.$^{-1}$ to about $25\times10^{-3}$ °C.$^{-1}$, measured at 600° C.

In particular, the sealing means comprises a thin metal-comprising layer which is coupled to each of the materials which the seal bridges. The material comprising the thin metal-comprising layer preferably exhibits a coefficient of expansion similar to one of the materials to be bridged. Typically the metal-comprising layer is selected to have a thermal expansion coefficient relatively close to the lowest thermal expansion coefficient material to be bridged. When the metal-comprising layer bridges between a metal (or metal alloy) and a ceramic material such as alumina or aluminum nitride, the metal-comprising layer is selected to have a linear thermal expansion coefficient in the range of about $2\times10^{-3}$ to about $6\times10^{-3}$ in./in./°C. at about 600° C., and preferably in the range of about $2\times10^{-3}$ to about $4\times10^{-3}$ in./in./°C. at about 600° C. The cross-sectional thickness of the thin metal-comprising layer is typically less than 0.039 in. (1 mm).

The preferred method of coupling the thin metal-comprising layer to the materials being bridged is brazing. By brazing, it is meant that the thin, metal-comprising layer is coupled to each of the materials being bridged using a third material as a coupling agent. The coupling agent or brazing material need not have a linear thermal expansion coefficient as low as that of the thin, metal-comprising layer, since the brazing material is designed to operate in combination with the relatively flexible, thin, metal-comprising layer. A critical parameter for the brazing material is that it wet out the surface of and bond well to the thin, metal comprising layer and to the surface of each material to be bridged. Another critical parameter is that the brazing material have the capability of relaxing stresses (that it is a low stress material). Thus, a material having a low Young's modulus with a high yield point makes a desirable brazing material.

The method of the present invention, is useful in a semiconductor processing chamber or reactor when it is necessary to provide a seal between processing areas within the chamber, when the seal bridges at least two surfaces which exhibit different linear thermal expansion coefficients, and when the operational temperature range for the semiconductor processing chamber is at least 300° C., the method comprises the steps:

a) providing at least two material surfaces which exhibit different linear thermal expansion coefficients;

b) providing a thin, metal-comprising layer of material having a linear coefficient of expansion closer to the lowest linear thermal coefficient of expansion material to be bridged; and c) brazing the metal comprising layer of material to each of the at least two surfaces which must be bridged by the seal, whereby the metal-comprising layer, brazing material and surfaces to which the metal-comprising layer is brazed act as a sealing apparatus.

Preferably the metal-comprising layer of material is braised to each surface to be bridged using a technique which provides an intermixing between molecules from the metal-comprising layer of material and the molecules of the material comprising each surface to be bridged. The preferred cross-sectional thickness of the metal-comprising layer of material is about 0.39 in. (1 mm) or less. Typically, the difference in linear coefficient of expansion of the materials comprising at least two of the surfaces to be bridged is at least about $3\times10^{-3}$ in./in./°C. (m/m/°C.) at about 600° C.

BRIEF DESCRIPTION OF THE DRAWINGS

FIG. 2 illustrates the present invention in one preferred embodiment; the same embodiment as shown in FIG. 1.

FIG. 3 shown a second preferred embodiment of the present invention.

FIG. 4 illustrates the preferred embodiment shown in FIG. 1, including dimensional indicators.

DETAILED DESCRIPTION OF THE PREFERRED EMBODIMENTS

Figure 1:
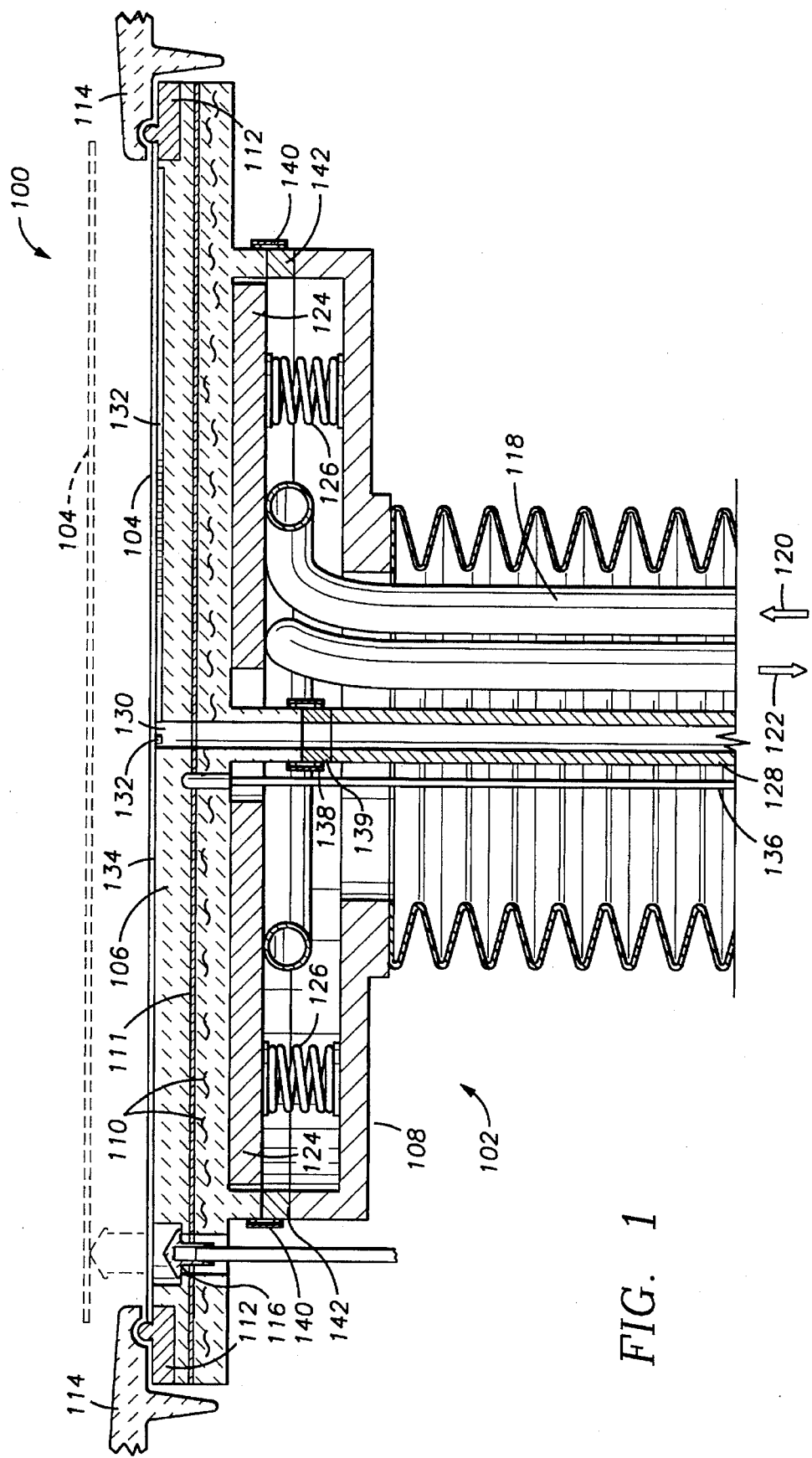
FIG. 1 shows a schematic of a substrate support platform and auxiliary apparatus used in semiconductor processing which employs the present invention sealing means.

The present invention pertains to a sealing means which can be used to bridge between two materials having substantially different linear coefficients of expansion during semiconductor processing, whereby different portions of the semiconductor processing chamber can be operated at different absolute pressures while the process operates over a large temperature range, for example, between room temperature and about 600° C.

One skilled in the art, having read the present disclosure, will have numerous applications for the present invention. However, the invention is especially useful in semiconductor processing when the substrate being processed is subjected to sputtering, ion injection or etching processes which generate heat, when an electrostatic chuck is used to support the substrate; and, when it is necessary to be able to cool the electrostatic chuck. The preferred embodiment of the invention described below is directed toward a sputtering process, but is equally applicable to any process which causes the substrate to heat up, requiring a heat removal capability.

FIG. 1 shows an apparatus 100 for use in semiconductor processing, including a substrate support platform 102. Substrate support platform 102 functions as an electrostatic chuck, wherein a non-magnetic, semiconductor or conductive substrate 104 forms the first plate of a capacitor; a dielectric inner layer is furnished by a portion of upper platen 106; and a second conductive plate is furnished by conductive layer 111 embedded within upper platen 106.

Support platform upper platen 106, is fabricated from a high thermal conductivity dielectric material such as pyrolyric boron nitride, aluminum nitride, silicon nitride, alumina or an equivalent material. Platform housing 108 is typically fabricated from a material such as stainless steel or aluminum, for example, with stainless steel being preferred.

Preferably upper platform platen 106 contains an embedded, electrically conductive heating pattern 110 which can be used to heat upper platen 106. Optionally, substrate support platform 102 comprises a removable insert 112 and may comprise a shadow ring 114. Insert 112 is a recyclable element which is used to capture back-scattered deposition materials and to prevent the need to clean upper platen 106. Insert 112 is constructed from a relatively inexpensive material having a coefficient of expansion similar to that of the dielectric material comprising upper platen 106. An example of an acceptable insert material is aluminum.

Lift fingers 116 are used in combination with substrate support platform 102 to enable the lifting of a substrate 104 above upper platen 106, so substrate 104 can be grasped by a mechanical device (not shown) used move the substrate within the semiconductor processing chamber (not shown) which surrounds support platform 102.

Cooling of substrate 104 is accomplished by cooling upper platen 106 and transferring heat from substrate 104 to upper platen 106. Upper platen 106 is cooled using a cooling coil 118, wherein a first heat transfer fluid passes into cooling coil 118 at entry 120 and exits through exit 122. Although cooling coil 118 can be used directly adjacent platform platen 106, typically a cooling plate 124 is used in combination with cooling coil 118 to provide a more uniform heat transtar between upper platen 106 and cooling coil 118. Use of cooling plate 124 reduces the amount of temperature differential required at an individual location on the surface of upper platen 106. If cooling coil 118 is located right next to the dielectric material comprising upper platen 106, an abrupt temperature difference at this location can cause damage to the structure of the dielectric material.

Spring support 126 is used to maintain close contact between upper platen 106 and cooling plate 124. Cooling coil 118 is typically fabricated from aluminum, stainless steel, or copper, for example. Cooling plate 124 is typically fabricated from stainless steel, tungsten, molybdenum, or Kovar®, for example. In an alternative embodiment of cooling plate 124, a layer of material having a low linear thermal expansion coefficient, such as tungsten, molybdenum, or Kovar®, could be braised to upper platen 106, with a second heat conductive plate of a material such as stainless steel being attached to that layer.

As described in the Background Art section of this disclosure, the semiconductor processing of substrate 104 is carded out in a partial vacuum, wherein the absolute pressure is frequently as low as 0.1 mTorr. Thus, a second heat transfer fluid may be used to obtain heat transfer between substrate 104 and upper platen 106 (despite the relatively flat surfaces and good contact between substrate 104 and upper platen 106). Conduit 128 is used to transfer the second heat transfer fluid from a source not shown in FIG. 1. Conduit 128 is attached to platform platen 106, whereby the second heat transfer fluid can flow to opening 130 and into open channels 132 upon the upper surface 134 of support platen 106. A thermocouple 136 is used to sense the temperature of platform platen 106 and to transfer information to a controller which calls for either heating of platform platen 106 by electrically conductive elements 110 or for cooling of platform platen 106 via cooling coil 118, which is preferably used in combination with cooling plate 124.

Since the process chamber surrounding substrate 104 is under the partial vacuum previously described, and since this partial vacuum would prevent any practical heat transfer between cooling coil 118, cooling plate 124, and platform platen 106, it is necessary to have a third heat transfer fluid (in the form of a gaseous atmosphere) present between cooling coil 118, cooling plate 124, and platform platen 106. This third heat transfer fluid can be one of the semiconductor process gases or air, conveniently. To enable use of the third heat transfer fluid, it is necessary to be able to isolate the portion of the process apparatus within which the third heat transfer fluid is to function from the portion of the apparatus within which the substrate is treated. This is accomplished using sealing means 138 and 140.

Sealing means 138 bridges between conduit 128 and upper platen 106. Sealing means 140 bridges between support platform housing 108 and upper platen 106. Sealing means 138 is comprised of a thin, metal-comprising strip or ribbon which is braised at one edge to the surface of upper platen 106 and at the other edge to either conduit 128 or to a first extension 139, as shown in FIG. 1. Sealing means 140 is comprised of a thin, metal-comprising strip or ribbon which is braised at one edge to upper platen 106 and at the other edge to either support platform housing 108 or a second extension 142, as shown in FIG. 1. Sealing means 138 and 140 should be capable of withstanding a pressure differential of about 15 psi over an operational temperature range from about 0° C to about 600° C.

As previously stated, upper platen 106 is preferably constructed from a dielectric material such as pyrolyric boron nitride, aluminum nitride, silicon nitride, or alumina. Pyrolytic boron nitride is an anisotropic material which has a thermal coefficient of expansion across its planar length and width directions of about $1.5 \times 10^{-3}$ in./in./°C. at about 600° C. and a thermal coefficient of expansion across its cross-sectional thickness of about $40 \times 10^{-3}$ in./in./°C. at about 600° C. Alumina is more isotropic, having a thermal expansion coefficient of about $0.008 \times 10^{-3}$ in./in./°C. at 600° C. Aluminum nitride is also more isotropic, having a thermal expansion coefficient of $0.01 \times 10^{-3}$ in./in./°C. at 600° C.

Conduit 128 which must be attached to upper platen 106 is constructed from a material such as stainless steel or copper, for example; these materials have a linear thermal expansion coefficient at about 600° C. ranging from about $6.8 \times 10^{-3}$ to $12 \times 10^{-3}$ in./in./°C. at about 600° C. Support platform housing 108 is constructed from a material such as stainless steel or aluminum, for example; these materials have a linear thermal expansion coefficient ranging from about $6.8 \times 10^{-3}$ to $15.9 \times 10^{-3}$ in./in./°C. at about 600° C. To help compensate for the effect of the mismatched (difference) in linear created in the sealing apparatus when alumina or aluminum nitride comprises upper platen 106, it is preferable to weld an extension 139 to Conduit 128 and an extension 142 to platform housing 108, which extension is comprised of a material having a linear thermal coefficient of expansion, in the range of about $2 \times 10^{-3}$ to $4 \times 10^{-3}$ in./in./°C. at about 600° C., for example. Materials which have a linear thermal expansion coefficient in this range and which can be used to form extensions 139 and 142 include, but are not limited to, molybdenum, tantalum, titanium, tungsten and Kovar®. Since there is not a crucial amount of heat transferred between extension 139 and conduit 128 or between extension 140 and platform housing 108, the extensions can be welded to conduit 128 and platform housing 108 without creating any significant thermal expansion mismatch problem.

FIG. 2 shows an enlargement of sealing means 140; however, the general description applicable to sealing means 140 can be applied to sealing means 138 as well. Sealing means 140 is comprised of a thin metal-comprised layer 202 (in the form of a strip, band or ribbon. ) The preferred material of construction for layer 202, when upper platen 106 is comprised of alumina or aluminum nitride, is one which has a relatively low linear coefficient of thermal expansion. Preferred materials for use in layer 202, when upper platen 106 is comprised of pyrolytic boron nitride or a different dielectric material having a higher thermal expansion coefficient, include materials which have a higher thermal expansion coefficient but which tend to relax stress, such as nickel, silver, silver/titanium alloy and nickel/iron alloys, for example but not by way of limitation.

Brazing material 204, as previously described, must wet out the surface of and bond to the materials which are to be attached to each other by the brazing. Further, it is important that brazing material 204 be capable of relaxing stresses created therein. Preferred materials for use as brazing material 204 include silver, nickel, silver/copper solder, silver/titanium solder, nickel/iron alloys and silver/titanium alloys, by way of example. Testing to date has indicted that nickel makes a particularly good brazing material. Testing is done by fabricating a sealing apparatus and then cycling the sealing apparatus between about room temperature and about 600° C. for at least several hundred cycles. Temperature cycling is followed by vacuum testing over the process operational temperature range, with atmospheric pressure on one side of the seal and about $10^{-10}$ Torr absolute pressure on the other side of the seal. If the vacuum testing indicates no leakage, the seal is considered to be performing in a satisfactory manner.

Metal-comprised layer 202 preferably has a cross-sectional thickness, shown in FIG. 4 as "a", of about 0.039 in. (1 mm) or less. The thickness of metal-comprised layer 202 is important in determining the flexibility of sealing means 140, and flexibility is critical to ability of sealing means 140 to perform. The composition of metal comprised layer 202 preferably exhibits a relatively low linear coefficient of thermal expansion when alumina or aluminum nitride comprises upper platen 106. Preferably, the linear expansion coefficient ranges from about $2\times10^{-3}$ in./in./°C. to about $7\times10^{-3}$ in./in./°C. at about 600° C.

Thin, metal comprising layer 202 can vary in height, shown in FIG. 4 as "b", depending on the particular sealing apparatus application. For the preferred embodiment of the sealing apparatus shown in FIG. 1, the height of thin, metal-comprising layer 140 is typically about 0.195 in. (5 mm) or less. The length of the strip or ribbon of thin, metal comprising-layer 202 depends on the sealing apparatus application, but must extend completely along the length of the surfaces to be bridged as necessary to provide a seal.

With reference to FIG. 2, brazing material 204 is applied along the edges of metal-comprising layer 202 for its entire length. Application of brazing material 204 is adjacent upper and lower exterior edges 206 and 208, respectively, of metal-comprising layer 202 and is adjacent to the complimentary surfaces of support platform housing 108 and upper platen 106 which are to be in contact with metal-comprising layer 202 via brazing material 204. Brazing is carded out in a brazing furnace until such time that molecular intermixing is achieved between brazing material 204 and the surface material of metal-comprising layer 202; between brazing material 204 and the surface of the material comprising support platform housing 108 extension 142; and between brazing material 204 and the surface of the material comprising upper platen 106. The time and temperature profile of the brazing material process depend on the materials involved.

FIG. 3 shows an alternative embodiment of the sealing means, 300. Sealing means 300 is comprised of a thin, metal-comprising layer 302 in the form of an accordion strip which is braised to upper platen 306 and platform housing 108 extension 142 via brazing material 304. The materials of construction of metal-comprising layer 302 and brazing material 304 are the same as those described with reference to metal-comprising layer 202 and brazing material 204 of FIG. 2. The use of an accordion-shaped strip as the metal-comprising layer 302 increases the flexibility of layer 302 so sealing means 300 can accommodate a greater difference in linear expansion coefficient between upper platen 306 and support platform housing 308. Further, the amount of stress induced within brazing material 304 is reduced by this alternative design.

The above-described preferred embodiments of the present invention are not intended to limit the scope of the present invention as demonstrated by the claims which follow, as one skilled in the art can, with minimal experimentation, extend the disclosed concepts of the invention to the claimed scope of the invention.

What is claimed is:

1. A method of providing a seal between adjacent surfaces of a semiconductor processing apparatus, which method enables the operation of one portion of a semiconductor processing chamber at one pressure while another portion of said processing chamber is operated at a higher pressure, wherein said seal bridges at least two surfaces which exhibit different linear thermal expansion coefficients and when the operational temperature range of said processing chamber is at least 300° C., said method comprising:

a) providing at least a first and second material surfaces which exhibit a different thermal expansion coefficient;

b) providing a thin, metal-comprising layer of material having a linear coefficient of expansion closer to the lowest linear thermal expansion coefficient material to be bridged;

c) brazing said thin, metal-comprising layer along a first edge to said first material surface by a first bead of brazing material, and brazing said thin, metal-comprising layer along a second edge to said second material surface by a second bead of brazing material, said thin, metal comprising layer sealingly contacting said first and second material surfaces only through said first and second beads, whereby said metal-comprising layer, a brazing material, and said material surfaces to which the metal-comprising layer is brazed act as a sealing apparatus.

2. The method of claim 1, wherein said brazing is carried out using a brazing material capable of relaxing stress.

3. The method of claim 1, wherein said difference in thermal expansion coefficient is at least $3\times10^{-3}$ in./in./°C. at about 600° C.

* * * * *